United States Patent
Kosuga et al.

(10) Patent No.: US 10,833,050 B1
(45) Date of Patent: Nov. 10, 2020

(54) INTERPOSER, ELECTRONIC SUBSTRATE, AND METHOD FOR PRODUCING ELECTRONIC SUBSTRATE

(71) Applicant: LENOVO (SINGAPORE) PTE. LTD., Singapore (SG)

(72) Inventors: Tadashi Kosuga, Yokohama (JP); Tin-Lup Wong, Morrisville, NC (US)

(73) Assignee: LENOVO (SINGAPORE) PTE. LTD., Singapore (SG)

(*) Notice: Subject to any disclaimer, the term of this patent is extended or adjusted under 35 U.S.C. 154(b) by 0 days.

(21) Appl. No.: 16/530,700

(22) Filed: Aug. 2, 2019

Related U.S. Application Data

(60) Provisional application No. 62/851,350, filed on May 22, 2019.

(51) Int. Cl.
*H01L 23/00* (2006.01)

(52) U.S. Cl.
CPC ............... *H01L 24/81* (2013.01); *H01L 24/16* (2013.01); *H01L 2224/10155* (2013.01); *H01L 2224/16227* (2013.01); *H01L 2224/81007* (2013.01); *H01L 2224/81815* (2013.01)

(58) Field of Classification Search
CPC .................................. H01L 24/81; H01L 24/16
See application file for complete search history.

(56) References Cited

U.S. PATENT DOCUMENTS

| | | | |
|---|---|---|---|
| 6,544,816 B1* | 4/2003 | Lim | ...................... H01L 21/565 257/685 |
| 2004/0036170 A1* | 2/2004 | Lee | ...................... H01L 21/4853 257/734 |
| 2019/0019758 A1* | 1/2019 | Kim | ...................... H01L 21/563 |

FOREIGN PATENT DOCUMENTS

JP  2016-143357 A  8/2016

\* cited by examiner

*Primary Examiner* — Douglas M Menz
(74) *Attorney, Agent, or Firm* — Shimokaji IP

(57) ABSTRACT

An interposer is capable of efficiently reinforcing the connecting portion between an electronic component and a substrate. The interposer is used for mounting a first electronic component on a substrate and includes a sheet-shaped spacer having at least one through-hole and including a material that does not flow during reflow soldering and a resin portion that covers at least a part of the spacer and is flowable during reflow soldering, and the through-hole is configured to store a bump of the first electronic component.

14 Claims, 18 Drawing Sheets

INTERPOSER, ELECTRONIC SUBSTRATE, AND METHOD FOR PRODUCING ELECTRONIC SUBSTRATE

CROSS REFERENCE TO RELATED APPLICATIONS

This application claims the benefit of and priority to U.S. provisional application No. 62/851,350 filed May 22, 2019 which is incorporated herein.

FIELD OF THE INVENTION

The present invention relates to an interposer, an electronic substrate, and a method for producing an electronic substrate.

BACKGROUND OF THE INVENTION

Electronic components have been mounted on substrates with solder. To downsize electronic apparatuses, an electronic component is mounted on a substrate by flip-chip bonding or the like, and to reinforce a connecting portion between the electronic component and the substrate, a resin material is packed between the electronic component and the substrate, or a resin material is applied to corner areas of the electronic component (for example, see Japanese Unexamined Patent Application Publication No. 2016-143357).

SUMMARY OF THE INVENTION

The technique disclosed in Japanese Unexamined Patent Application Publication No. 2016-143357 needs additional steps for packing a resin material after mounting an electronic component and for curing the resin material. Packing of a resin material can reinforce the connecting portion, but the resin material and the substrate have a large difference in thermal expansion coefficient, and thus the connecting portion may be broken by thermal stress when a thermal load is applied.

In view of the above circumstances, the present invention is intended to provide an interposer capable of effectively reinforcing a connecting portion between an electronic component and a substrate, an electronic substrate, and a method for producing an electronic substrate.

An interposer according to the first aspect of the present invention is an interposer used for mounting a first electronic component on a substrate, the interposer includes: a sheet-shaped spacer having at least one through-hole and including a material that does not flow during reflow soldering; and a resin portion that covers at least a part of the spacer and is flowable during reflow soldering, and the through-hole is configured to store a bump of the first electronic component.

An electronic substrate according to the second aspect of the present invention includes: a substrate; a first electronic component having a bump mounted on the substrate; and interposer including a sheet-shaped spacer having at least one through-hole storing a bump of the first electronic component; and a resin portion covering at least a part of the spacer, an electrode of the substrate and the bump of the first electronic component are electrically connected through a first solder alloy, and the resin portion is physically connected to the substrate and the first electronic component.

A method for producing an electronic substrate according to the third aspect of the present invention includes: placing, on an upper face of a substrate, an interposer that includes a sheet-shaped spacer having at least one through-hole and including a material that does not flow during reflow soldering and includes a resin portion that covers at least a part of the spacer and is flowable during reflow soldering; packing a first solder alloy in the through-hole of the interposer; placing a first electronic component on an upper face of the interposer such that a bump of the first electronic component is stored in the through-hole of the interposer; and heating the substrate, the interposer, and the first electronic component at a temperature at which the first solder alloy melts and the resin portion is cured.

The above-described aspects of the present invention can avoid breakage of a connecting portion between an electronic component and a substrate even when a thermal stress is applied.

DETAILED DESCRIPTION OF THE INVENTION

Preferred embodiments of an interposer, an electronic substrate, and a method for producing an electronic substrate according to the present invention will now be described in detail with reference to the accompanying drawings.

Figure 1:
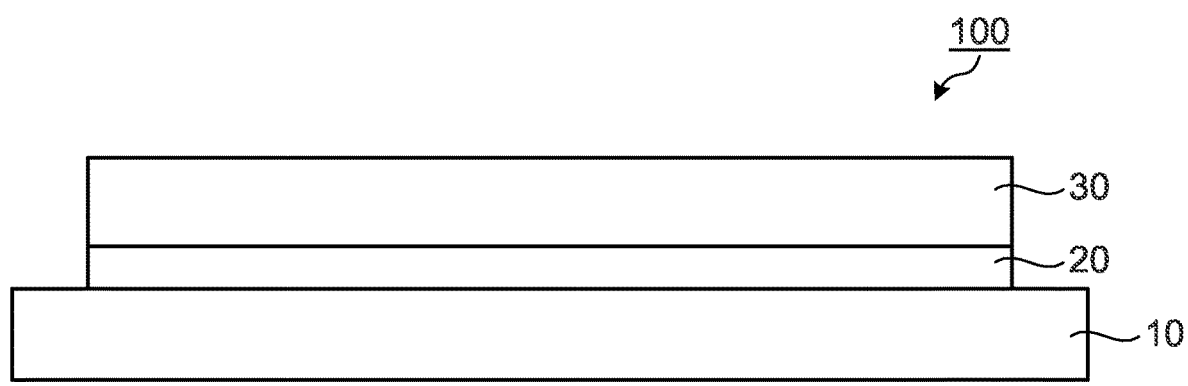
FIG. 1 is a schematic view of an electronic substrate according to a first embodiment.

FIG. 1 is a schematic view of an electronic substrate 100 according to a first embodiment. The electronic substrate 100 includes a substrate 10, an interposer 20, and a first electronic component 30. The electronic substrate 100 includes the single first electronic component 30 mounted through the interposer 20 on the substrate 10, but an electronic substrate 100 may include two or more first electronic components 30 mounted on a substrate 10.

Figure 3A:
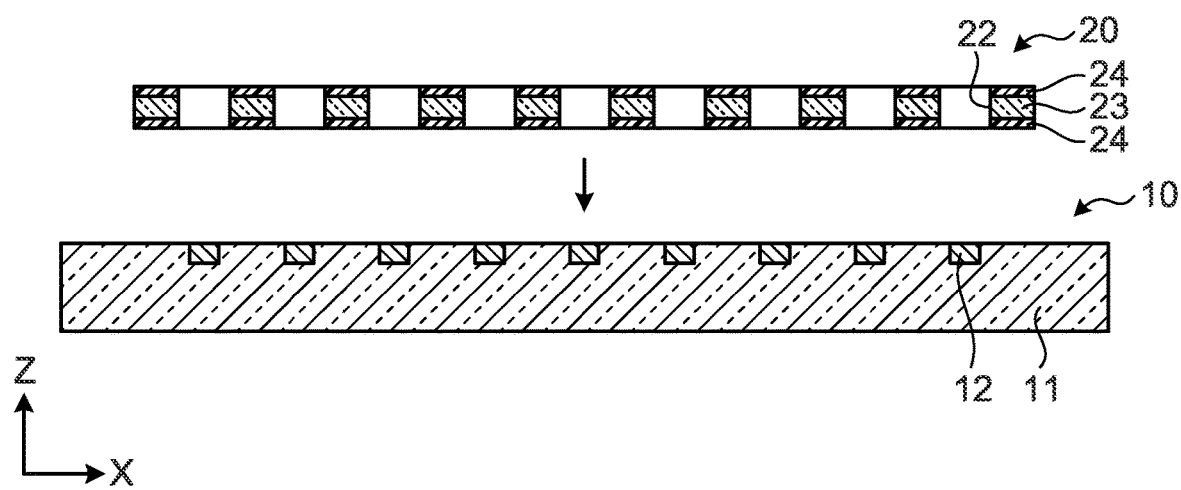
FIG. 3A is a view illustrating a method for producing the electronic substrate according to the first embodiment.

The substrate 10 includes a base portion 11 formed from an insulator and electrodes 12 formed from an electric conductor (see FIG. 3A and the like). The first electronic component 30 includes a main body 31 and bumps 32 to be electrically connected to the electrodes 12 of the substrate 10 (see FIG. 3C and the like).

The first electronic component 30 includes the main body 31 and the bumps 32 and is to be mounted with the electrodes 12 of the substrate 10 by reflow soldering. The first electronic component 30 may be any electronic component that is to be mounted through bumps 32 on a substrate 10 and is preferably a ball grid array (BGA) or a chip size package (CSP). The bump 32 includes a ball of a BGA. The bump 32 is made from a solder ball, gold, copper, or the like, and the bump 32 has a diameter of, for example, 100 to 1,000 μm.

Figure 2A:
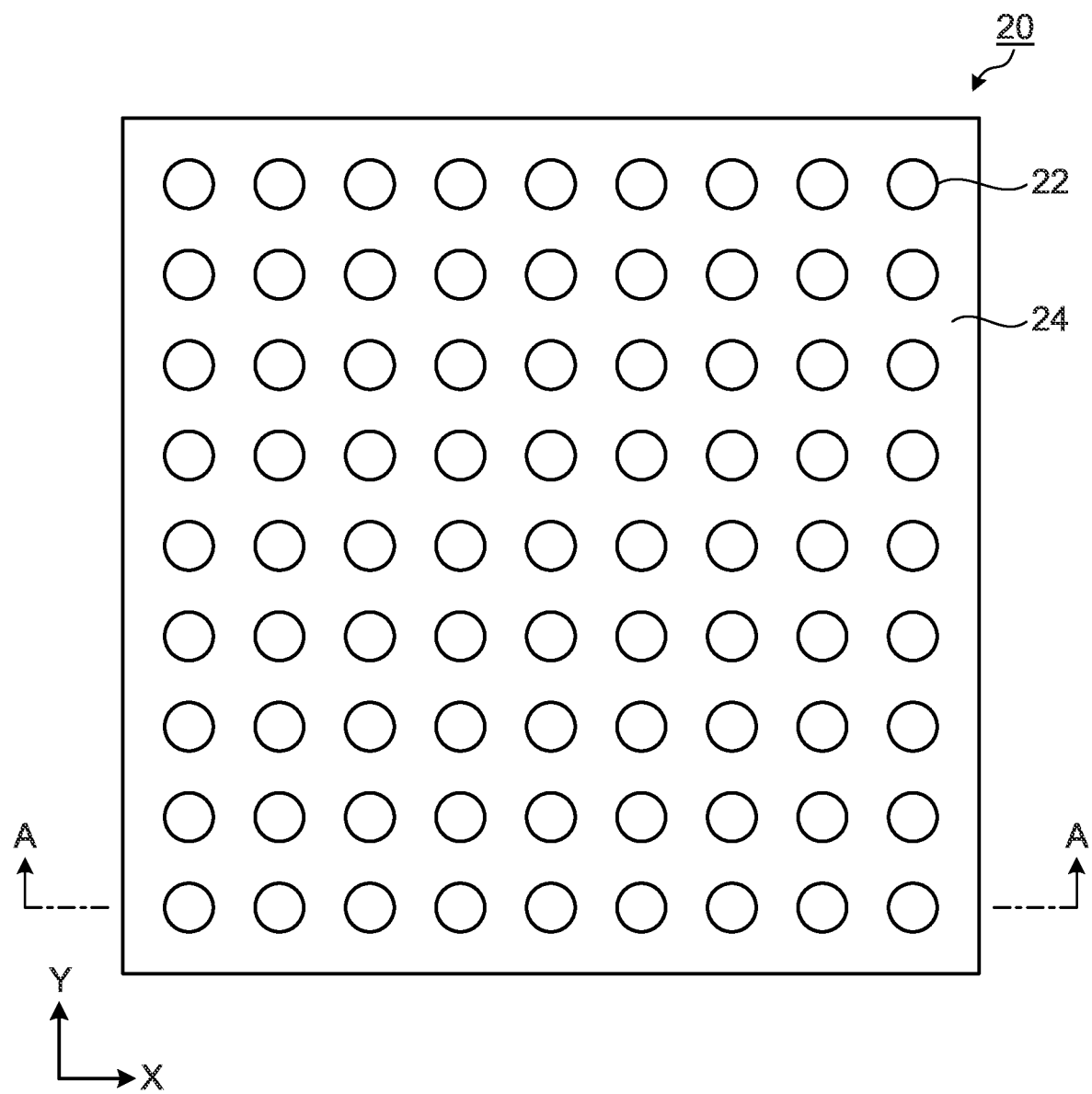
FIG. 2A is a plan view of an interposer according to the first embodiment.
Figure 2B:
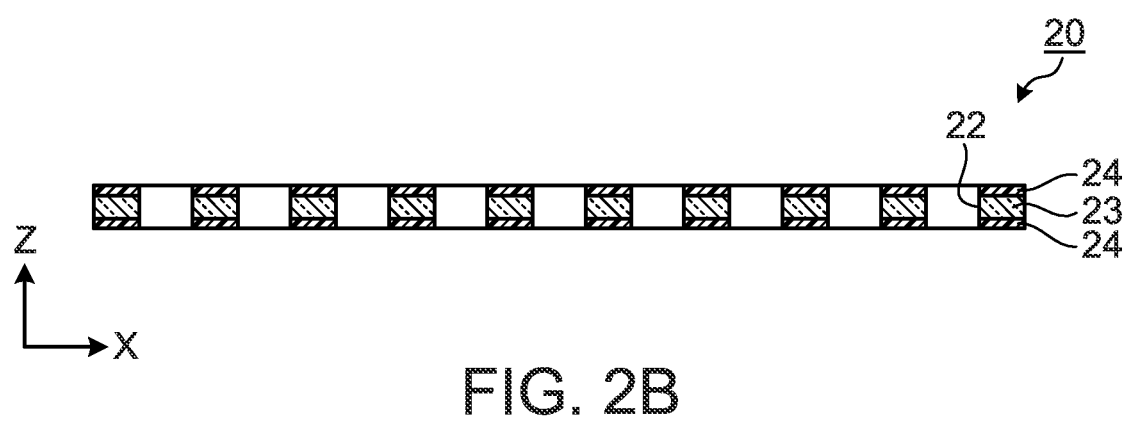
FIG. 2B is a cross-sectional view taken along line A-A in FIG. 2A.

FIG. 2A is a plan view of an interposer 20 according to the first embodiment, and FIG. 2B is a cross-sectional view taken along line A-A in FIG. 2A. The interposer 20 includes a sheet-shaped spacer 23 having through-holes 22 and resin portions 24 covering the upper face and lower face of the spacer 23. In the example in FIG. 2A, the number of the through-holes 22 of the interposer 20 is 81, which is the same as that of the bumps 32 of the first electronic component 30. The through-holes 22 are provided at positions corresponding to the bumps 32 of the first electronic component 30 and each have such a size as to store (receive) the corresponding bump 32 when the first electronic component 30 is placed on the interposer 20. The through-hole 22 may have a diameter equal to or larger than the diameter of the bump 32 and is about 1.05 to 1.20 times the diameter of the bump 32 in order to facilitate the storage (receipt) of the bump 32 in the through-hole 22, to downsize an electronic substrate 100, and to allow the resin portion 24 to protect the connecting portion between the electrode 12 and the bump 32. In FIG. 2A, the through-hole 22 has a cylinder shape, but the shape is not limited to this and may be a prismatic shape as long as the bump 32 can be stored.

The spacer 23 is formed from a material that does not flow (non-flowable) during reflow soldering. The spacer 23 is preferably formed from an insulating material having a smaller thermal expansion coefficient than that of the resin portion 24, such as ceramics. The resin portion 24 is flowable during reflow soldering. The resin portion 24 preferably includes an underfill material such as an epoxy resin, a silicone resin, and an acrylic resin, and is preferably prepared by application of such an underfill material onto the upper face and lower face of the spacer 23 and subsequent preliminary curing. A previously cured resin portion 24 enables formation of through-holes 22 with a predetermined shape. By using, in addition to the resin portion 24, as the material constituting a main body 21 of the interposer 20, a spacer having a small thermal expansion coefficient or having a small difference in thermal expansion coefficient from the material of the base portion 11 of the substrate 10, the thermal expansion and thermal shrinkage of the interposer 20 can be reduced, and this can reduce the thermal stress applied to the connecting portions between the bumps 32 and the electrodes 12 to suppress breakage of the connecting portions. The resin portion 24 may contain a filler such as glass. The interposer 20 may include a cover film covering the resin portion 24. In the present specification, the thickness direction of an interposer 20 is regarded as a vertical direction (Z-direction), one direction orthogonal to the vertical direction is regarded as a transverse direction (X-direction), and the direction orthogonal to the vertical direction and the transverse direction is regarded as a longitudinal direction (Y-direction). An interposer 20 has an upper face that is to come into contact with a first electronic component 30, and the face to come into contact with a substrate 10 is regarded as a lower face.

Next, a method for producing an electronic component 100 will be described with reference to figures. FIG. 3A to FIG. 3E are views illustrating a method for producing the electronic substrate 100 according to the first embodiment. The method for producing the electronic substrate 100 includes a first placing step, a packing step, a second placing step, and a mounting step.

In the first placing step, the lower face of an interposer 20 is allowed to face a substrate 10 and is placed on the substrate 10 as shown in FIG. 3A. The placing is performed in such a way that the positions of through-holes 22 of the interposer 20 are fitted onto electrodes 12 of the substrate 10. The fitting can be performed by image control, positioning pins, or the like.

Figure 3B:
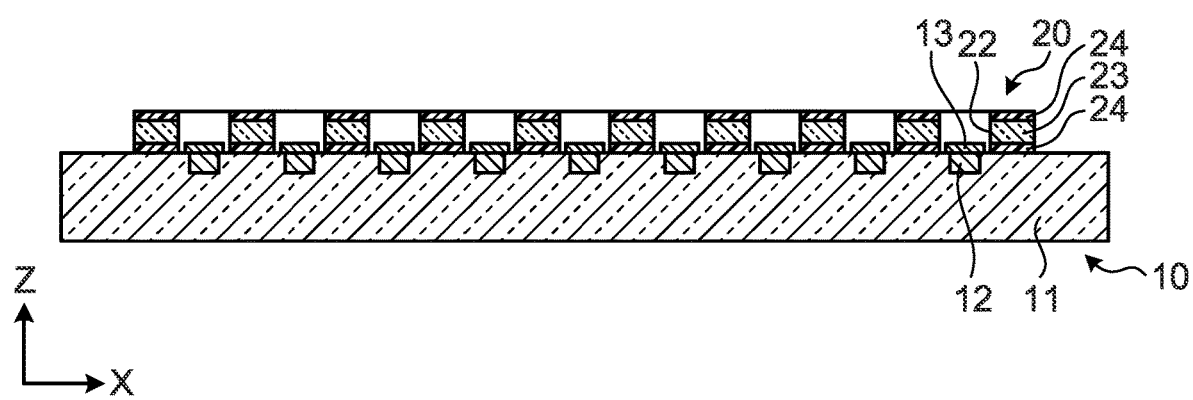
FIG. 3B is a view illustrating the method for producing the electronic substrate according to the first embodiment.

In the packing step, a first solder alloy 13 is packed in the through-holes 22 of the interposer 20 as shown in FIG. 3B. The first solder alloy 13 is printed on the electrodes 12 in the through-holes 22 through the interposer 20 as a mask.

The first solder alloy 13 is preferably a solder alloy having a melting point lower than that of bumps 32. The first solder alloy 13 preferably has a melting point of, for example, 150° C. or less. By using a low-melting solder alloy as the first solder alloy 13, the first electronic component 30 can be mounted at a lower heating temperature, and this can reduce the thermal load applied to the first electronic component 30. Examples of the solder alloy having a melting point of 150° C. or less include Sn—Bi solder alloys. Specific examples of the Sn—Bi solder alloy include Sn—Bi solder alloy, Sn—Bi—Cu solder alloy, Sn—Bi—Ni solder alloy, Sn—Bi—Cu—Ni solder alloy, Sn—Bi—Ag solder alloy, and Sn—Bi—Sb solder alloy.

The Sn—Bi solder alloy preferably has a Bi content of 30 to 80% by mass. When having a Bi content within the range, for example, a solder alloy can have a melting point of 138° C. In order to reduce the melting point, the Bi content is more preferably 35 to 70% by mass and particularly preferably 53 to 61% by mass. When Cu or Ni is added to the Sn—Bi solder alloy, such a component is preferably added at a Cu content of 0.1 to 1.0% by mass or a Ni content of 0.01 to 0.1% by mass.

As the material of the bumps 32, for example, Sn—Cu solder alloy, Sn—Ag solder alloy, Sn—Ag—Cu solder alloy, Sn—Ag—Cu—Ni solder alloy, Sn—Ag—Cu—Sb solder alloy, Sn—Ag—Cu—Ni—Sb solder alloy, or the like can be used. The material of the bumps 32 is preferably a solder alloy having such a melting point that the bumps do not melt when the first electronic component 30 is mounted, such as a solder alloy having a high melting point of 200° C. or more, but a low-melting solder that melts at the time of mounting of the first electronic component 30 may be used.

Figure 3C:
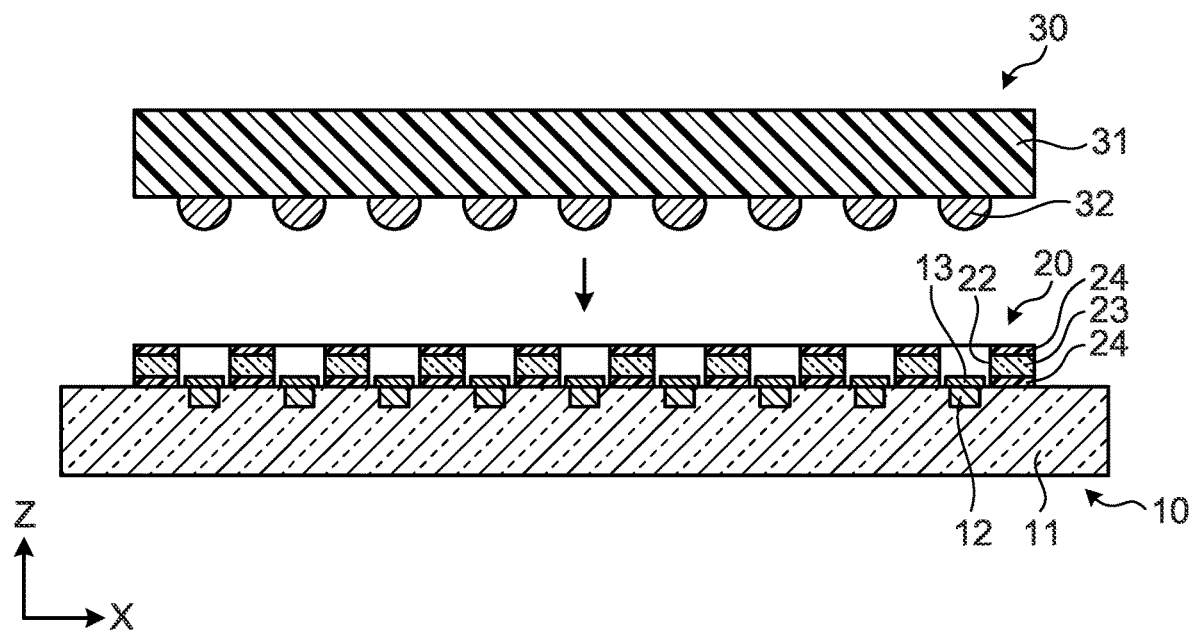
FIG. 3C is a view illustrating the method for producing the electronic substrate according to the first embodiment.
Figure 3D:
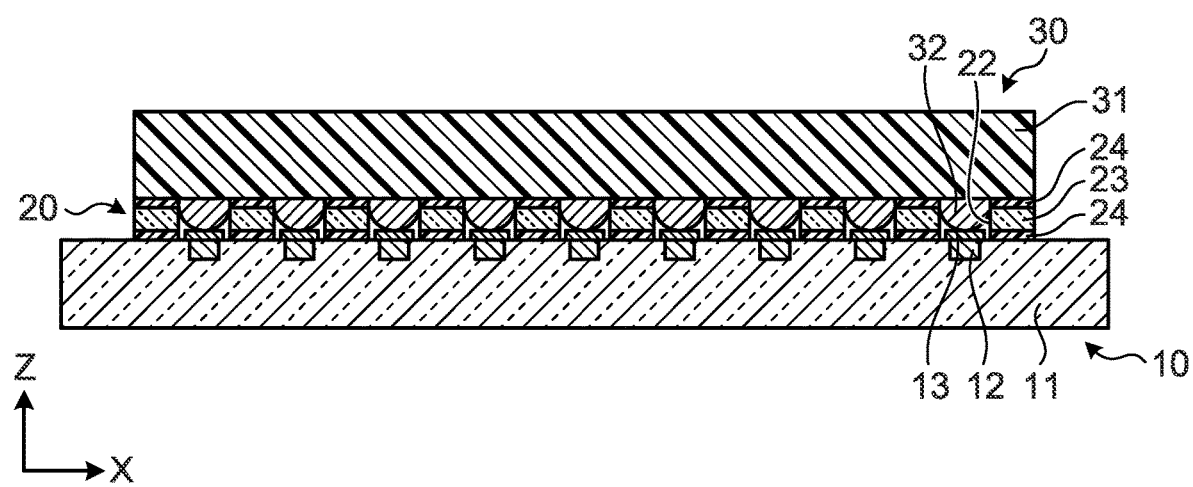
FIG. 3D is a view illustrating the method for producing the electronic substrate according to the first embodiment.

The second placing step is a step of placing a first electronic component 30 on the upper face of the interposer 20 as shown in, FIG. 3C and FIG. 3D. The second placing step is performed in such a way that the positions of bumps 32 of the first electronic component 30 are fitted onto the through-holes 22 of the interposer 20. By the fitting, the bumps 32 are stored (positioned) in the through-holes 22. The fitting can be performed by image control, positioning pins, or the like. The amount or the like of the first solder alloy 13 is preferably adjusted so that the bumps 32 come into contact with the first solder alloy 13. When the self-weight of a first electronic component 30 can bring bumps 32 into contact with a first solder alloy 13 to enable electrical connection to electrodes 12 in the mounting step of the first electronic component 30 described later, the bumps 32 are not necessarily in contact with the first solder alloy 13 in the second placing step.

Figure 3E:
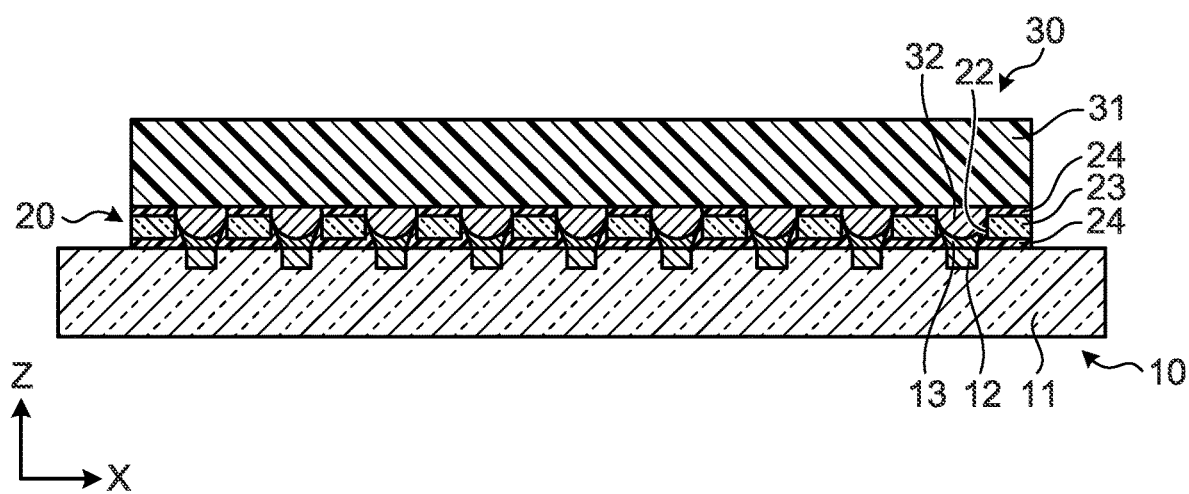
FIG. 3E is a view illustrating the method for producing the electronic substrate according to the first embodiment.

In the mounting step, the bumps 32 of the first electronic component 30 are electrically connected to the electrodes 12 of the substrate 10 through the first solder alloy 13, as shown in FIG. 3E. The mounting step is preferably performed by reflowing. The mounting step is performed by heating the substrate 10 and the first electronic component 30 interposing the interposer 20 therebetween, in a reflow furnace. By heat, the first solder alloy 13 melts, and the bumps 32 and the electrodes 12 are electrically connected through the first solder alloy 13. In addition, the previously cured resin portions 24 are cured by heat and physically connect the first electronic component 30 to the spacer 23 and the spacer 23 to the substrate 10. In the mounting step, the heating temperature is, for example, 150 to 180° C. Before reflowing, preheating at about 50 to 100° C. may be performed to remove solvents in the first solder alloy 13.

As described above, in the electronic substrate 100 according to the first embodiment, the bumps 32 of the first electronic component 30 are electrically connected to the electrodes 12 of the substrate 10 through the first solder alloy 13, and the first electronic component 30 is physically connected to the substrate 10 through the resin portions 24. In the mounting step of the first electronic component 30 on the substrate 10, the interposer 20 is inserted between the first electronic component 30 and the substrate 10, and the resin portions 24 are allowed to function as underfill. This can eliminate an underfill packing step, and the electronic substrate 100 can be efficiently produced.

The electronic substrate 100 according to the first embodiment includes, as the material of the main body 21 of the interposer 20, the spacer 23 having a small thermal expansion coefficient, and this reduces the stress applied to the connection portions of the bumps 32 and the electrodes in association with thermal expansion and thermal shrinkage of the interposer 20. In addition, breakage of the connecting portions by a thermal stress can be suppressed, and thus the electronic substrate 100 obtains higher reliability.

The electronic substrate 100 according to the first embodiment may be produced as follows: on a substrate 10 having electrodes 12 on which a first solder alloy 13 is applied, an interposer 20 having through-holes 22 in which bumps 32 of a first electronic component 30 are stored is placed; and then the whole is heated for mounting.

Figure 4:
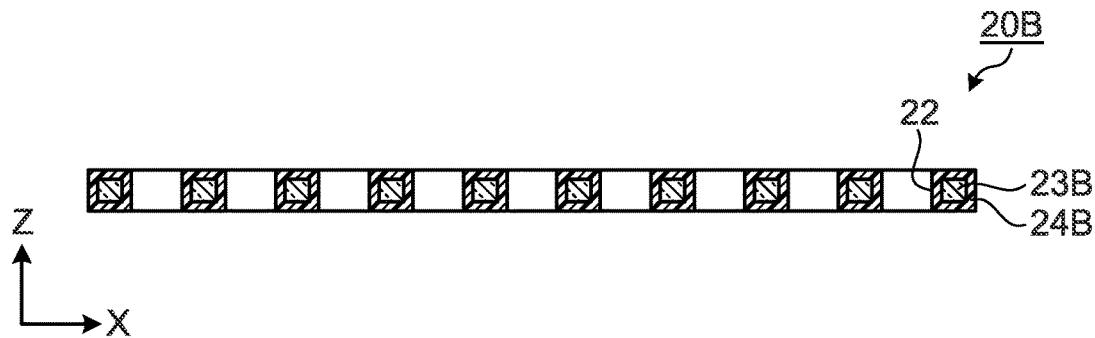
FIG. 4 is a cross-sectional view of an interposer according to a second embodiment.

FIG. 4 is a cross-sectional view of an interposer 20B according to a second embodiment. The interposer 20B has the same shape in a plan view as the interposer 20 of the first embodiment (see FIG. 2A), and FIG. 4 is a cross-sectional view taken along the same line as line A-A of the interposer 20. The second embodiment will next be described, but identical or substantially identical components to those in the above embodiment and the like have the same reference numerals and are not described, and only different components will be described.

The interposer 20B includes a spacer 23B having through-holes 22 and a resin portion 24B covering the upper face and lower face of the spacer 23B and the surface of the through-holes 22. The spacer 23B may be formed from a material that does not flow during reflow soldering and has a smaller thermal expansion coefficient than that of the resin portion 24B, such as an insulating material including ceramics, or may be formed from metal or the like. The resin portion 24B is formed from a material that is flowable during reflow soldering and is used as underfill, such as an epoxy resin, a silicone resin, and an acrylic resin, and is previously cured.

Figure 5:
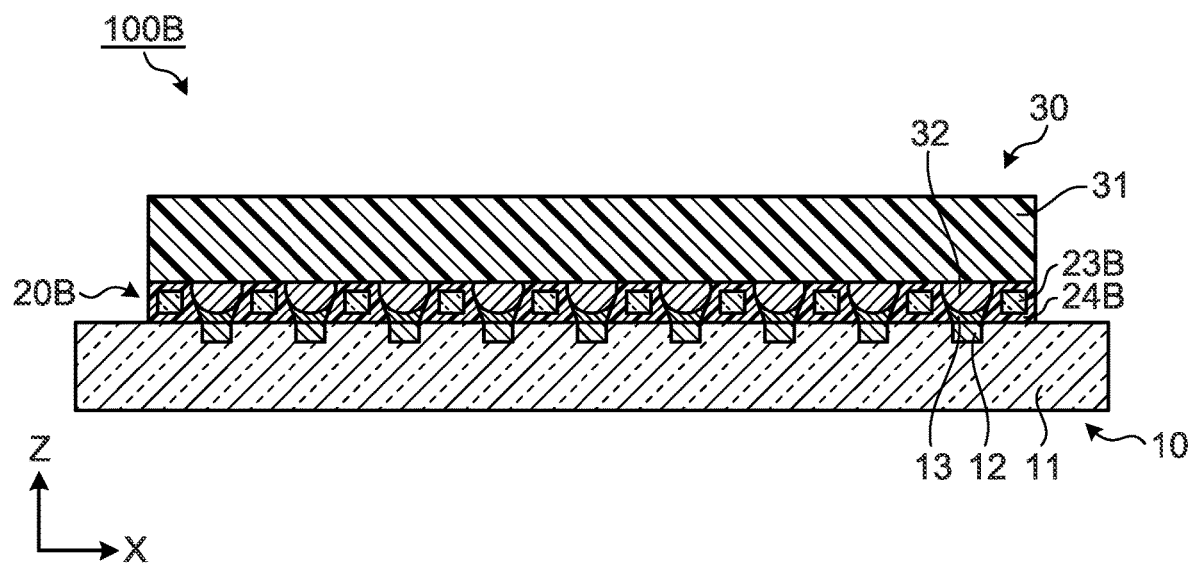
FIG. 5 is a cross-sectional view of an electronic substrate according to the second embodiment.

FIG. 5 is a cross-sectional view of an electronic substrate 100B according to the second embodiment. As with the electronic substrate 100 of the first embodiment, the electronic substrate 100B includes, as the material constituting the interposer 20B, the spacer 23B having a small thermal expansion coefficient, and this reduces the thermal stress applied to the connecting portions between the bumps 32 and the electrodes 12 in association with thermal expansion and thermal shrinkage of the interposer 20B. In addition, breakage of the connecting portions by a thermal stress can be suppressed, and thus the electronic substrate 100B obtains higher reliability. The interposer 20B has the structure in which the surface of the through-holes 22 are covered with the resin portion 24, thus the cured resin portion 24 physically connects the first electronic component 30 to the spacer 23B, the spacer 23B to the substrate 10, and the bumps 32, and the connecting portions obtains higher strength.

Figure 6:
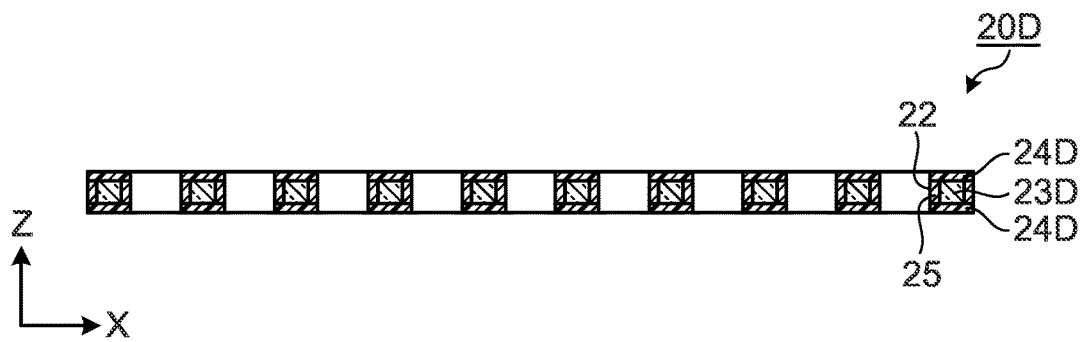
FIG. 6 is a cross-sectional view of an interposer according to a third embodiment.

FIG. 6 is a cross-sectional view of an interposer 20D according to a third embodiment. The interposer 20D has the same shape in a plan view as the interposer 20 of the first embodiment (see FIG. 2A), and FIG. 6 is a cross-sectional view taken along the same line as line A-A of the interposer 20. The third embodiment will next be described, but identical or substantially identical components to those in the above embodiments and the like have the same reference numerals and are not described, and only different components will be described.

The interposer 20D includes through-holes 22, a spacer 23D, resin portions 24D covering the upper face and lower face of the spacer 23D, and metal coatings 25 covering the surface of the through-holes 22. The spacer 23D is formed from an insulating material that does not flow during reflow soldering and has a smaller thermal expansion coefficient than that of the resin portions 24D, such as ceramics. The resin portion 24D is formed from a material that is flowable during reflow soldering and is used as underfill, such as an epoxy resin, a silicone resin, and an acrylic resin, and is previously cured. The metal coating 25 is made from copper, aluminum, silver, gold, or an alloy and may be a laminate of different metal coatings. The metal coating 25 is preferably made from the same material as the electrodes 12 of the substrate 10.

Figure 7:
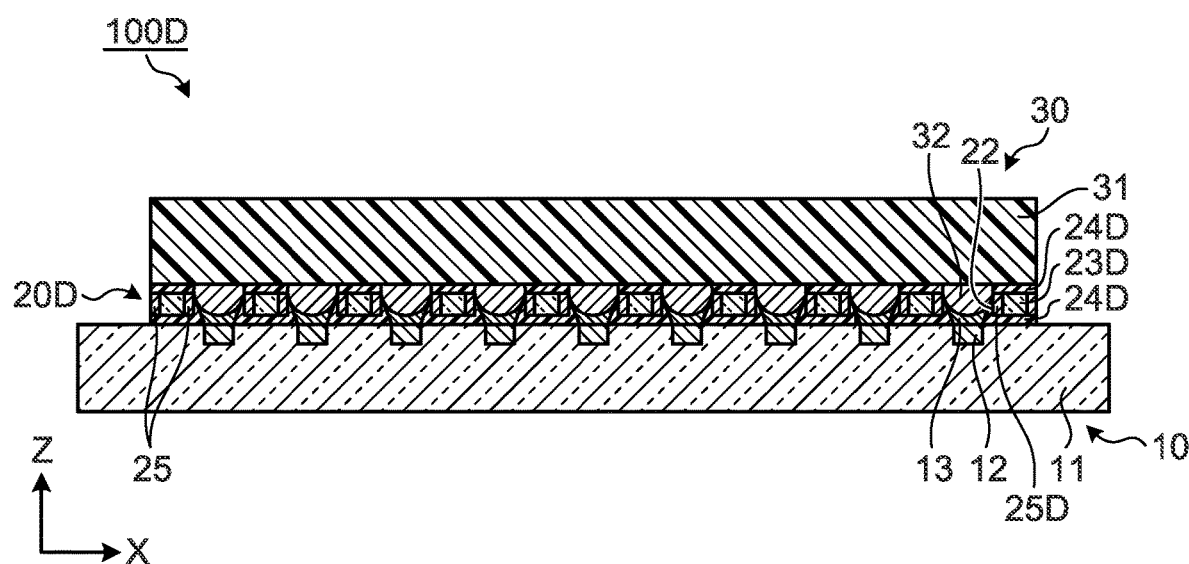
FIG. 7 is a cross-sectional view of an electronic substrate according to the third embodiment.

FIG. 7 is a cross-sectional view of an electronic substrate 100D according to the third embodiment. As with the above embodiments, the electronic substrate 100D includes, as the material constituting a main body 21D of the interposer 20D, the spacer 23D having a small thermal expansion coefficient, and this reduces the thermal stress applied to the connecting portions between the bumps 32 and the electrodes 12 in association with thermal expansion and thermal shrinkage of the interposer 20D. In addition, breakage of the connecting portions by a thermal stress can be suppressed, and thus the electronic substrate 100D obtains higher reliability. The interposer 20D has the structure in which the surface of the through-holes 22 are covered with the metal coating 25, thus the first solder alloy 13 physically connects the bumps 32 to the electrodes 12 and the bumps 32 to the metal coatings 25, and thus the connecting portions obtain higher strength.

Figure 8A:
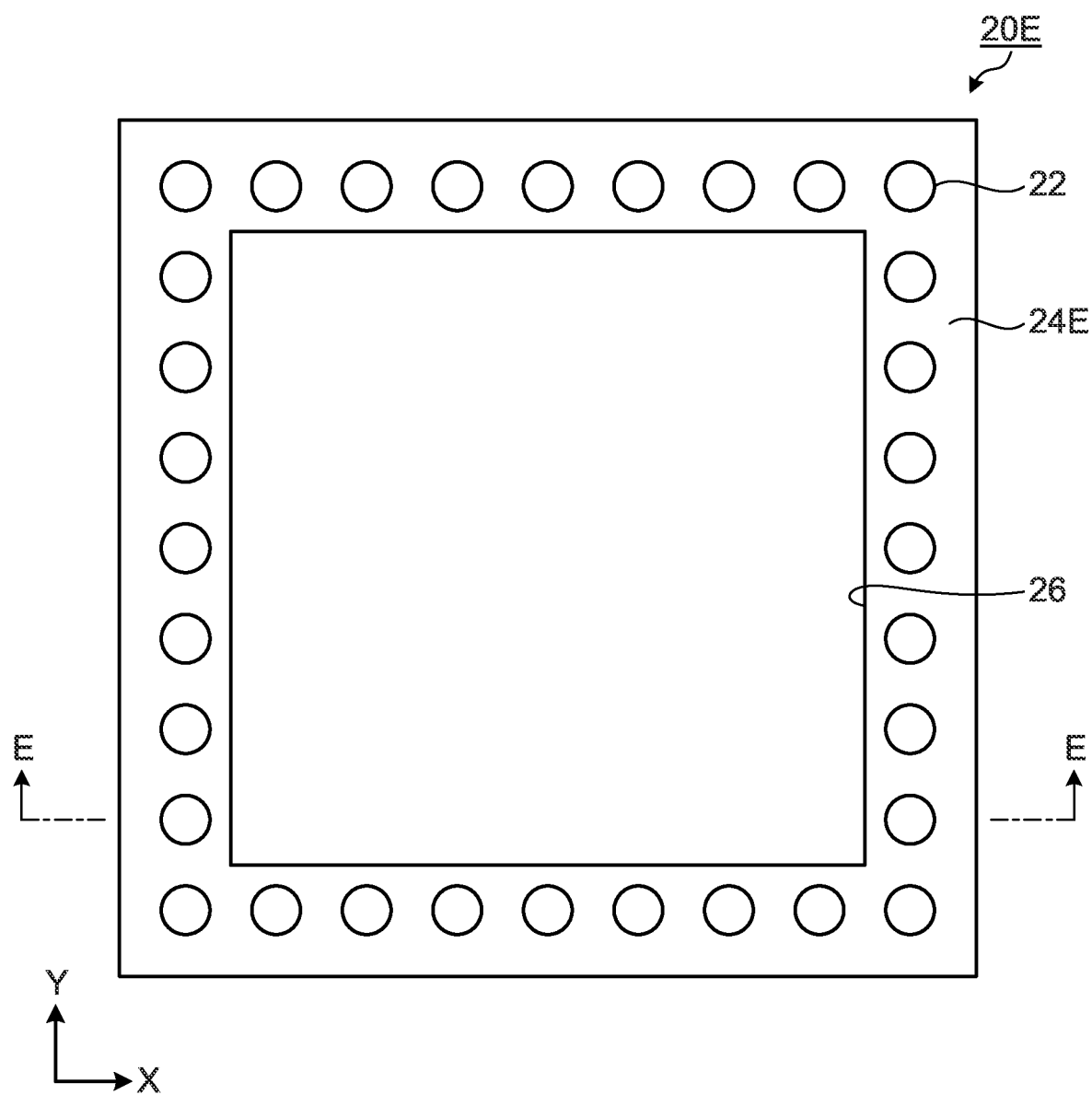
FIG. 8A is a plan view of an interposer according to a fourth embodiment.
Figure 8B:
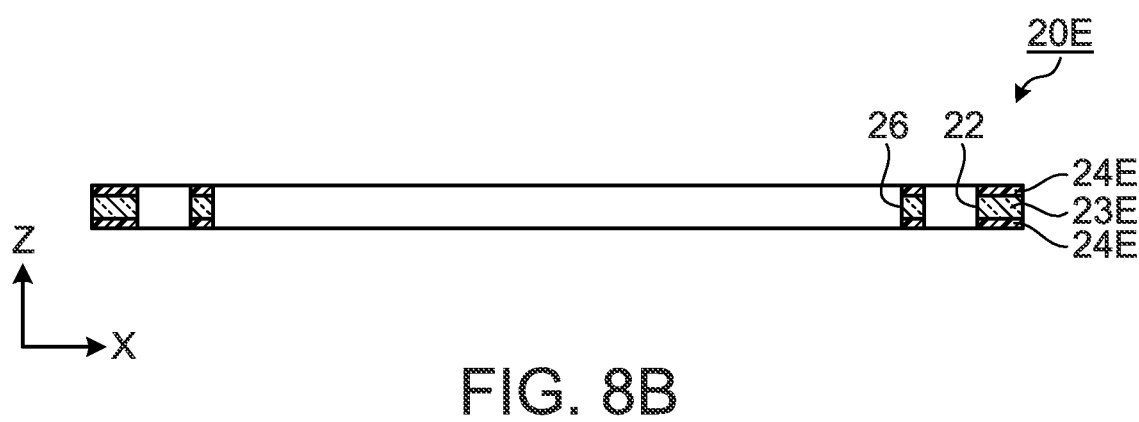
FIG. 8B is a cross-sectional view taken along line E-E in FIG. 8A.

FIG. 8A is a plan view of an interposer 20E according to a fourth embodiment, and FIG. 8B is a cross-sectional view taken along line E-E in FIG. 8A. In the interposer 20E, only a single line of through-holes 22 is arranged in the outer peripheral area of a spacer 23E, and the inner area from the outer peripheral area of the spacer 23E is hollowed into a void 26. The fourth embodiment will next be described, but identical or substantially identical components to those in the above embodiments and the like have the same reference numerals and are not described, and only different components will be described.

As shown in FIG. 8B, the interposer 20E includes a spacer 23E having through-holes 22 and resin portions 24E covering the upper face and lower face of the spacer 23E. The resin portions 24E may cover the upper face and lower face of the spacer 23B and the surface of the through-holes 22 as with the second embodiment, or a metal coating 25 covering the surface of the through-holes 22 may be provided as with the third embodiment.

Figure 9:
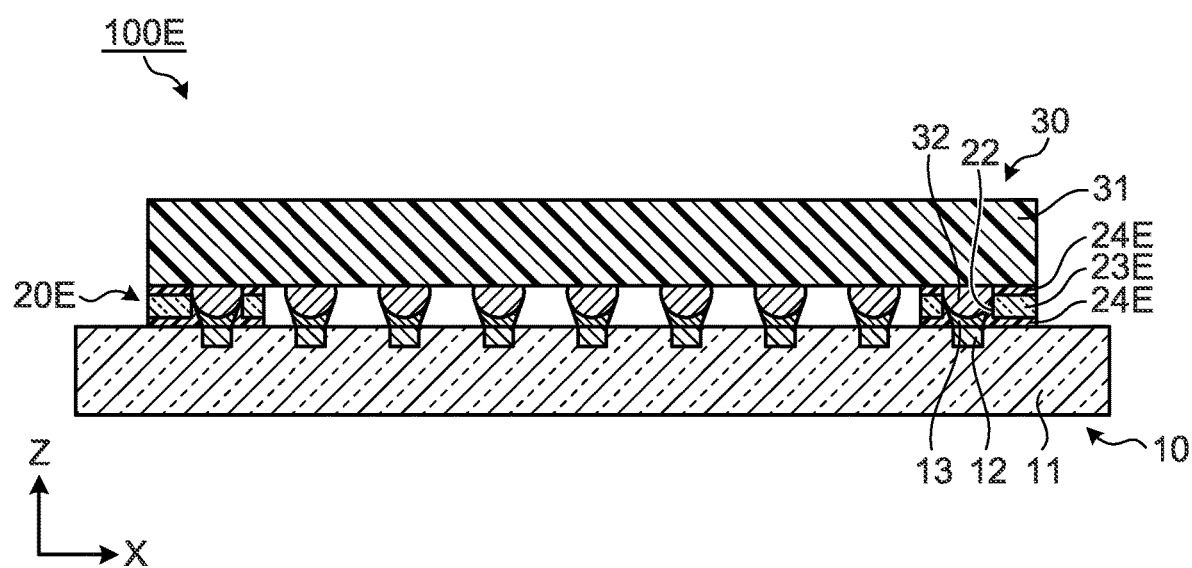
FIG. 9 is a cross-sectional view of an electronic substrate according to the fourth embodiment.

FIG. 9 is a cross-sectional view of an electronic substrate 100E according to the fourth embodiment. The electronic substrate 100E includes no spacer 23 or no resin portion 24 around bumps 32 of the first electronic component located in the void of the interposer 20E. In the electronic substrate 100E, the outer periphery of the connecting portion between the first electronic component 30 and the substrate 10 is sealed by the interposer 20E. and this can block the environmental effect including humidity on the connecting portion. As with the above embodiments, a spacer 23E having a small thermal expansion coefficient is used as the material constituting the spacer 23E of the interposer 20E, and this can reduce the stress applied to the connecting portions between the bumps 32 and the electrodes 12 in association with thermal expansion and thermal shrinkage of the interposer 20E and can reduce the possibility of breaking the connecting portions.

Figure 10A:
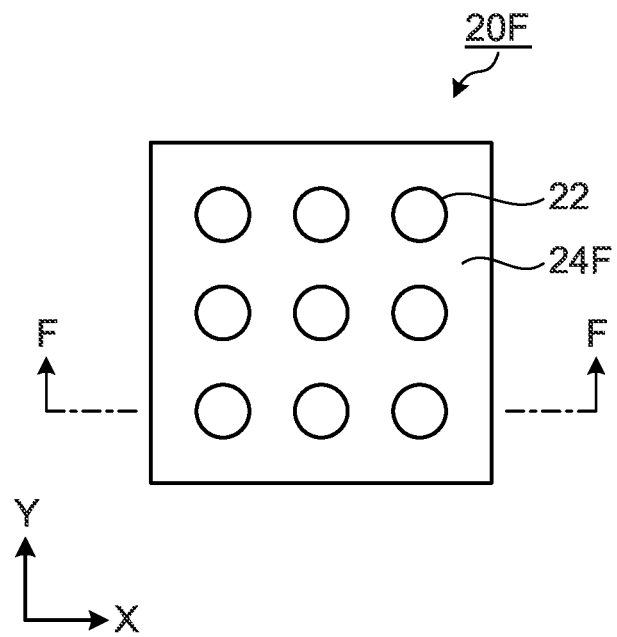
FIG. 10A is a plan view of an interposer according to a fifth embodiment.
Figure 10B:
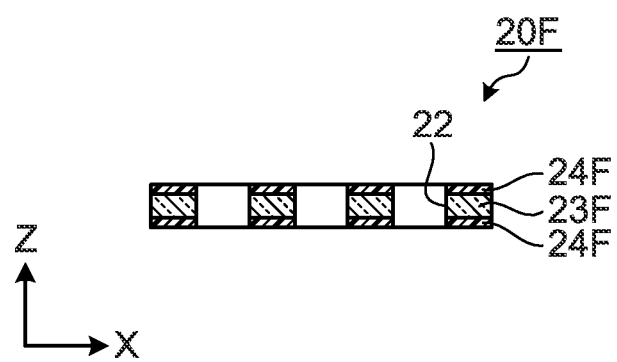
FIG. 10B is a cross-sectional view taken along line F-F in FIG. 10A.

FIG. 10A is a cross-sectional view of an interposer 20F according to a fifth embodiment, and FIG. 10B is a cross-sectional view taken along line F-F in FIG. 10A. The interposer 20F has nine through-holes 22. The fifth embodiment will next be described, but identical or substantially identical components to those in the above embodiments and the like have the same reference numerals and are not described, and only different components will be described.

As shown in FIG. 10B, an interposer 20F includes a spacer 23F having through-holes 22 and resin portions 24F covering the upper face and lower face of the spacer 23F. The resin portions 24E may cover the upper face and lower face of the spacer 23B and the surface of the through-holes 22 as with the second embodiment, or a metal coating 25 covering the surface of the through-holes 22 may be provided as with the third embodiment.

Figure 11:
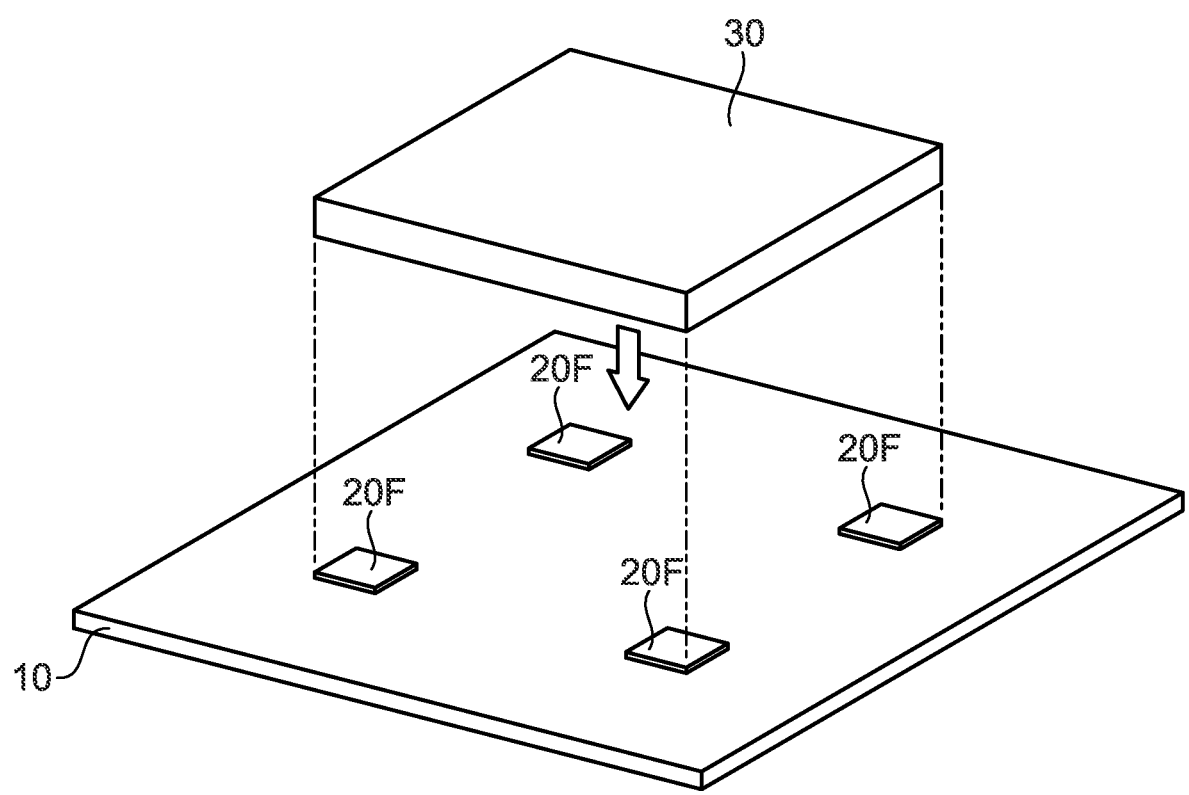
FIG. 11 is a view illustrating a method for producing an electronic substrate according to the fifth embodiment.

FIG. 11 is a view illustrating a method for producing an electronic substrate 100F according to the fifth embodiment. The electronic substrate 100F is produced through a first placing step, a packing step, a second placing step, and a mounting step, in the same manner as the electronic substrate 100 in the first embodiment. In the first placing step, interposers 20F each having a smaller area than that of a main body 31 of a first electronic component 30 are placed on a substrate 10 at positions corresponding to four corner areas of the first electronic component 30, as shown in FIG. 11. Subsequently, by performing a packing step of packing (inserting) or printing a first solder alloy 13 in the through-holes 22 of the interposer 20F and on electrodes 12 on the substrate 10 without the interposers 20F, then performing a second placing step of placing a first electronic component 30 in such a way that four corner areas thereof are fitted onto the corresponding interposers 20F, and performing a mounting step, an electronic substrate 100F can be produced.

In the electronic substrate 100F, the periphery of bumps 32 in the four corner areas on the first electronic component 30, to which the largest stress load is applied, is sealed and connected by the interposers 20F, and this can effectively protect the connecting portions between the bumps 32 and the electrodes 12 and can suppress breakage of the connecting portions by thermal stress or the like. As with the above embodiments, a material having a small thermal expansion coefficient is used as the material constituting the spacer 23F of the interposer 20F, and this can reduce the stress applied to the connecting portions between the bumps 32 and the electrodes 12 in association with thermal expansion and thermal shrinkage of the interposer 20F and can reduce the possibility of breaking the connecting portions.

In the fifth embodiment, four interposers 20F each having nine through-holes 22 are used, but the interposer is not limited to this. For example, interposers having a smaller area (for example, each having four through-holes) may be located in the four corner areas on the first electronic component 30 and in the areas located midway of the sides between the corners.

The electronic substrate 100F according to the fifth embodiment may be produced as follows: on a substrate 10F having electrodes 12 onto which a first solder alloy 13 is applied, interposers 20F each having through-holes 22 in which bumps 32 of the first electronic component 30 in the corner areas are stored are placed; and the whole is heated for mounting.

Figure 12A:
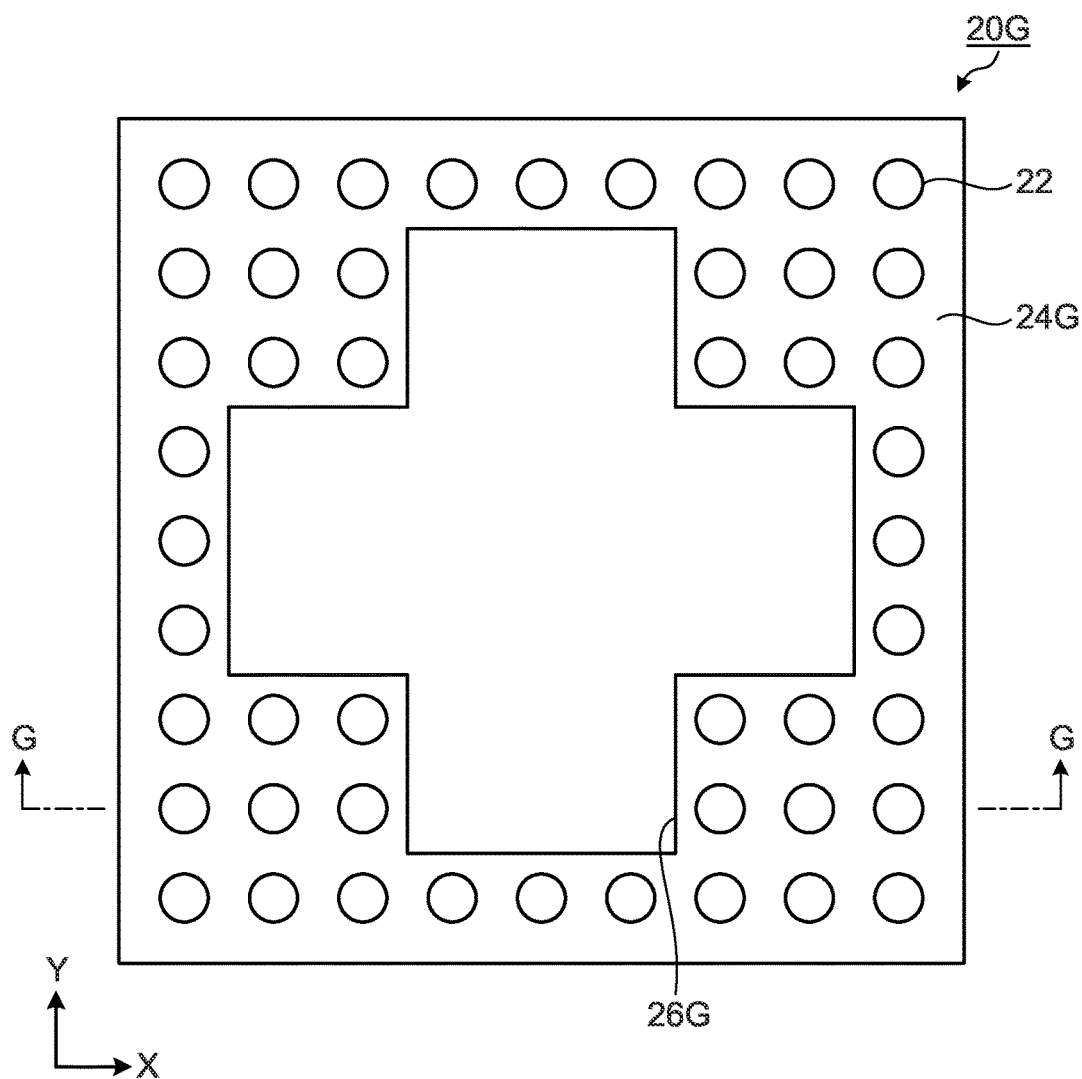
FIG. 12A is a plan view of an interposer according to a sixth embodiment.
Figure 12B:
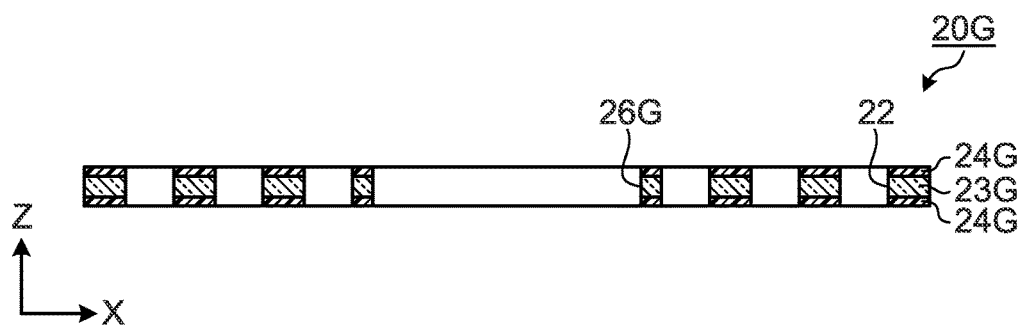
FIG. 12B is a cross-sectional view taken along line G-G in FIG. 12A.

FIG. 12A is a plan view of an interposer 20G according to a sixth embodiment, and FIG. 12B is a cross-sectional view taken along line G-G in FIG. 12A. In the interposer 20G, a single line of through-holes 22 is located in the outer peripheral area of the spacer 23G, and additional through-holes 22 are located in corner areas. The inner area of the spacer 23G other than the area with the through-holes 22 is hollowed into a void 26G. The sixth embodiment will next be described, but identical or substantially identical components to those in the above embodiments and the like have the same reference numerals and are not described, and only different components will be described.

As shown in FIG. 12B, the interposer 20G includes a spacer 23G having through-holes 22 and resin portions 24G covering the upper face and lower face of the spacer 23G. The resin portions 24G may cover the upper face and lower face of the spacer 23B and the surface of the through-holes 22 as with the second embodiment, or a metal coating 25 covering the surface of the through-holes 22 may be provided as with the third embodiment.

No spacer 23 or no resin portion 24 is present around bumps 32 located in the void 26G of the interposer 20G. In the electronic substrate including the interposer 20G, the outer periphery of the connection portion between the first electronic substrate and the substrate is sealed and connected by the interposer 20G, and this can block the environmental effect including humidity on the connection portion. By placing a large number of through-holes 22 in four corner areas, the connecting portion in the corner areas, to which a large stress load is applied, can be effectively protected. As with the above embodiments, a spacer 23 having a small thermal expansion coefficient is used as the material constituting a main body 21G of the interposer 20G, and this can reduce the stress applied to the connecting portions between the bumps 32 and the electrodes 12 in association with thermal expansion and thermal shrinkage of the interposer 20G and can reduce the possibility of breaking the connecting portions.

Figure 13:
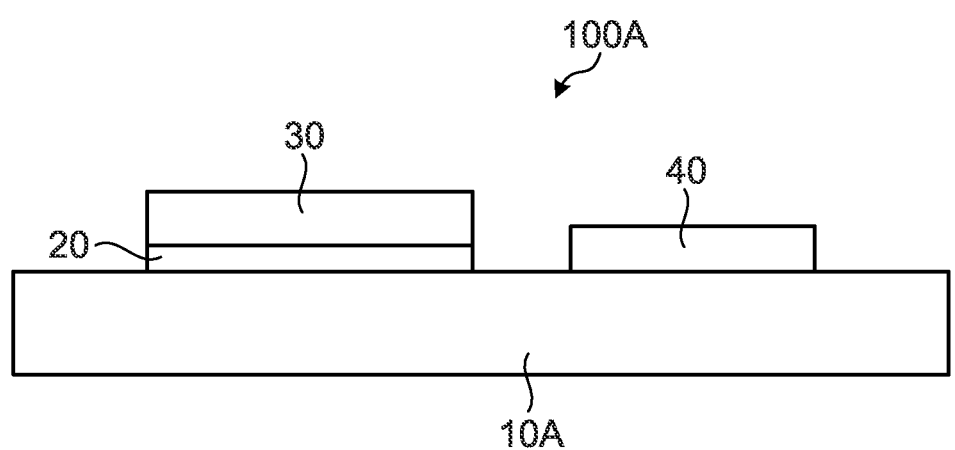
FIG. 13 is a schematic view of an electronic substrate according to a seventh embodiment.

FIG. 13 is a schematic view of an electronic substrate 100A according to a seventh embodiment. The electronic substrate 100A includes a substrate 10A, a first electronic component 30 mounted through an interposer 20 on the substrate 10A, and a second electronic component 40. In the electronic substrate 100A, the single first electronic component 30 and the single second electronic component 40 are mounted on the substrate 10A, and in another electronic substrate 100A, two or more first electronic components 30 and/or two or more second electronic components 40 may be mounted on a substrate 10A. The seventh embodiment will next be described, but identical or substantially identical components to those in the above embodiments have the same reference numerals and are not described, and only different components will be described.

As the first electronic component 30 and the second electronic component 40, integrated circuit (IC) chips such as a large scale integration (LSI) and a small scale integration (SSI) can be used. A component relatively expensive and susceptible to heat, such as a central processing unit (CPU), a graphic processing unit (GPU), a memory, and a solid state drive (SSD), is preferably used as the first electronic component 30, and another component is preferably used as the second electronic component 40.

Figure 14A:
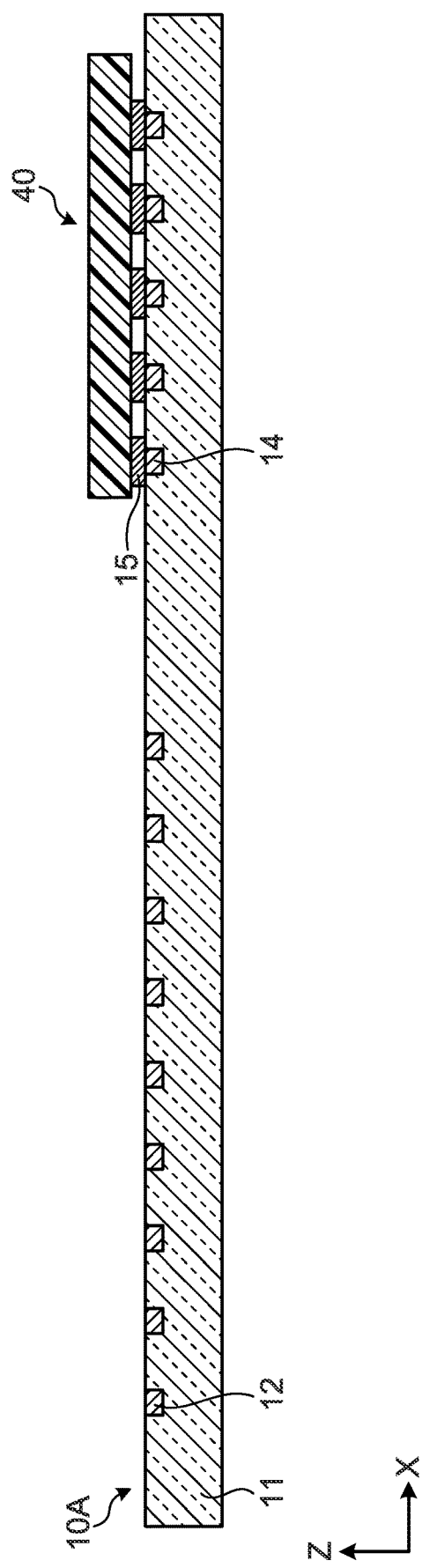
FIG. 14A is a view illustrating a method for producing the electronic substrate according to the seventh embodiment.

In the seventh embodiment, a preliminary mounting step is performed before a first placing step. In the preliminary mounting step, a second electronic component 40 is mounted on a substrate 10A as shown in FIG. 14A. The second electronic component 40 includes electrode portions (not shown), and the electrode portions are electrically connected through a second solder alloy 15 to electrodes 14. The preliminary mounting step is preferably performed by ref lowing. The second solder alloy 15 can be applied by printing through a mask on the electrodes 14 or by jet printing, for example.

After the preliminary mounting step, by performing a first placing step, a packing step, a second placing step, and a mounting step as shown in FIG. 14B to FIG. 14E, an electronic substrate 100A can be produced.

The second solder alloy 15 used in the seventh embodiment preferably has a higher melting point than that of the first solder alloy 13. In the seventh embodiment, the second electronic component 40 is connected to the electrodes 14 with the second solder alloy 15, and then the first electronic component 30 is connected to electrodes 12 with the first solder alloy 13. This is because the re-melting of the second solder alloy 15 is prevented at the time of mounting of the first electronic component 30. When a low-melting solder having a melting point of 150° C. or less is used as the first solder alloy 13, the second solder alloy 15 preferably has a melting point of about 180° C.

When a second electronic component 40 that has bumps and is to be flip-chip mounted on the substrate 10A is mounted, the interposer of the first embodiment having through-holes corresponding to the bumps of the second electronic component 40 may be used for mounting.

In addition to the effects of the first embodiment, the electronic substrate 100A according to the seventh embodiment can include different types of electronic components that are mounted in consideration of heat resistance or the like of the electronic components, and the electronic substrate 100A obtains higher reliability.

Figure 14B:
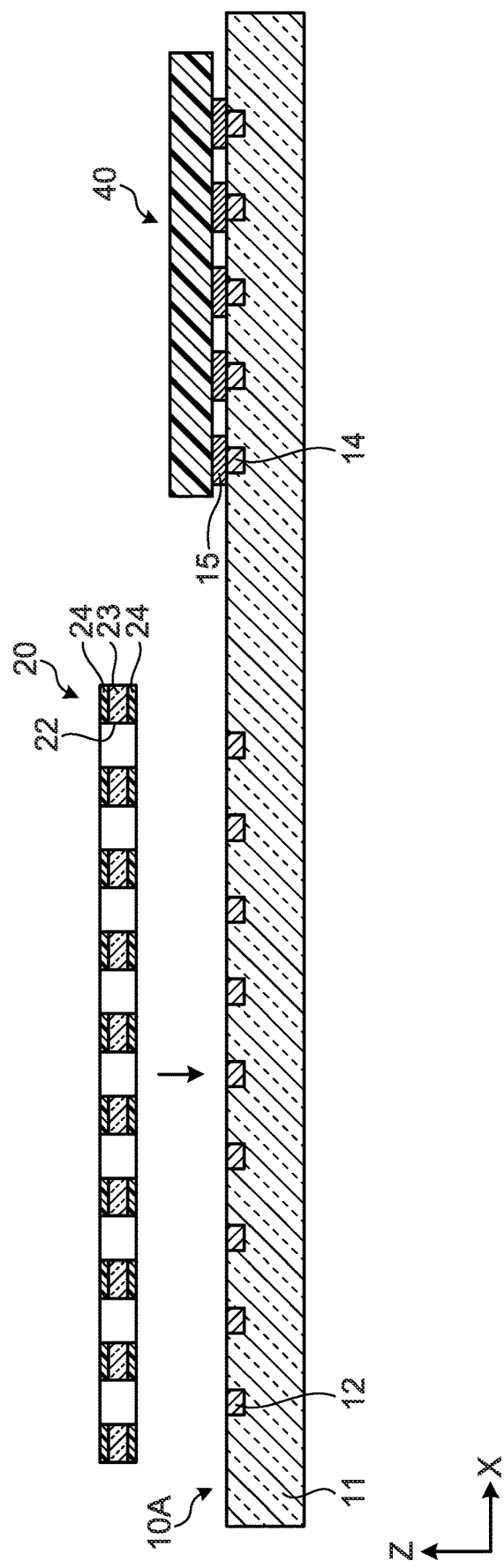
FIG. 14B is a view illustrating the method for producing the electronic substrate according to the seventh embodiment.
Figure 14C:
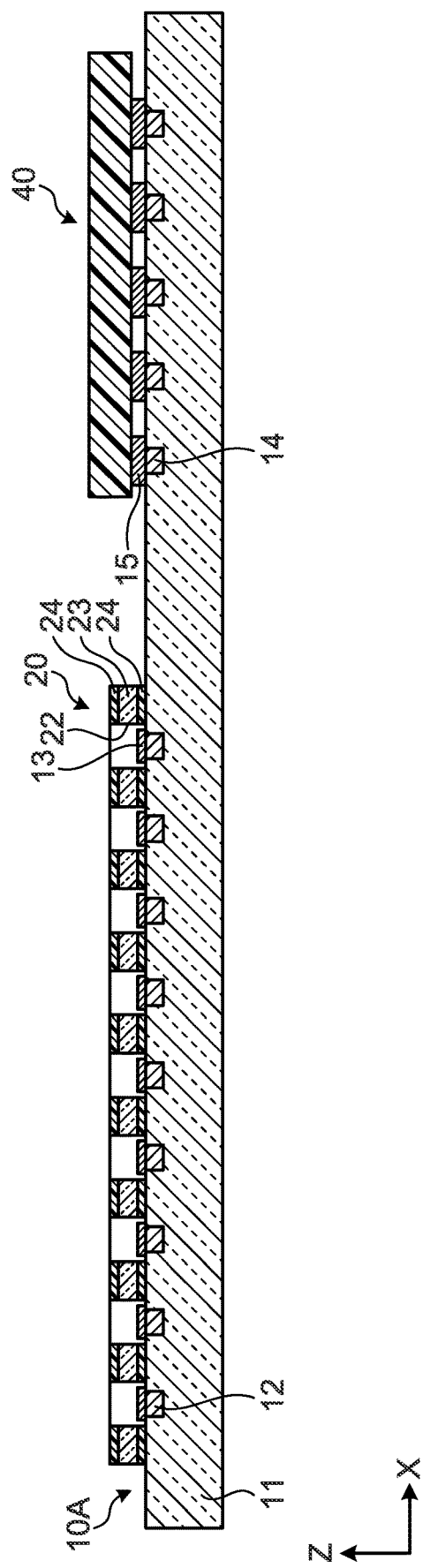
FIG. 14C is a view illustrating the method for producing the electronic substrate according to the seventh embodiment.
Figure 14D:
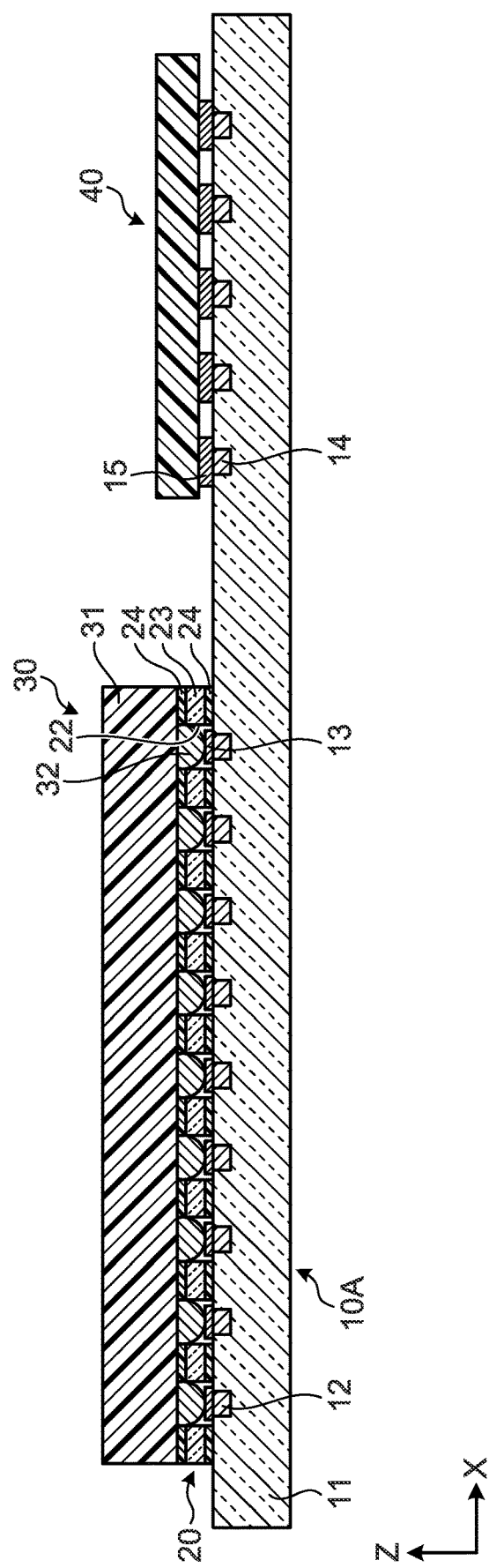
FIG. 14D is a view illustrating the method for producing the electronic substrate according to the seventh embodiment.
Figure 14E:
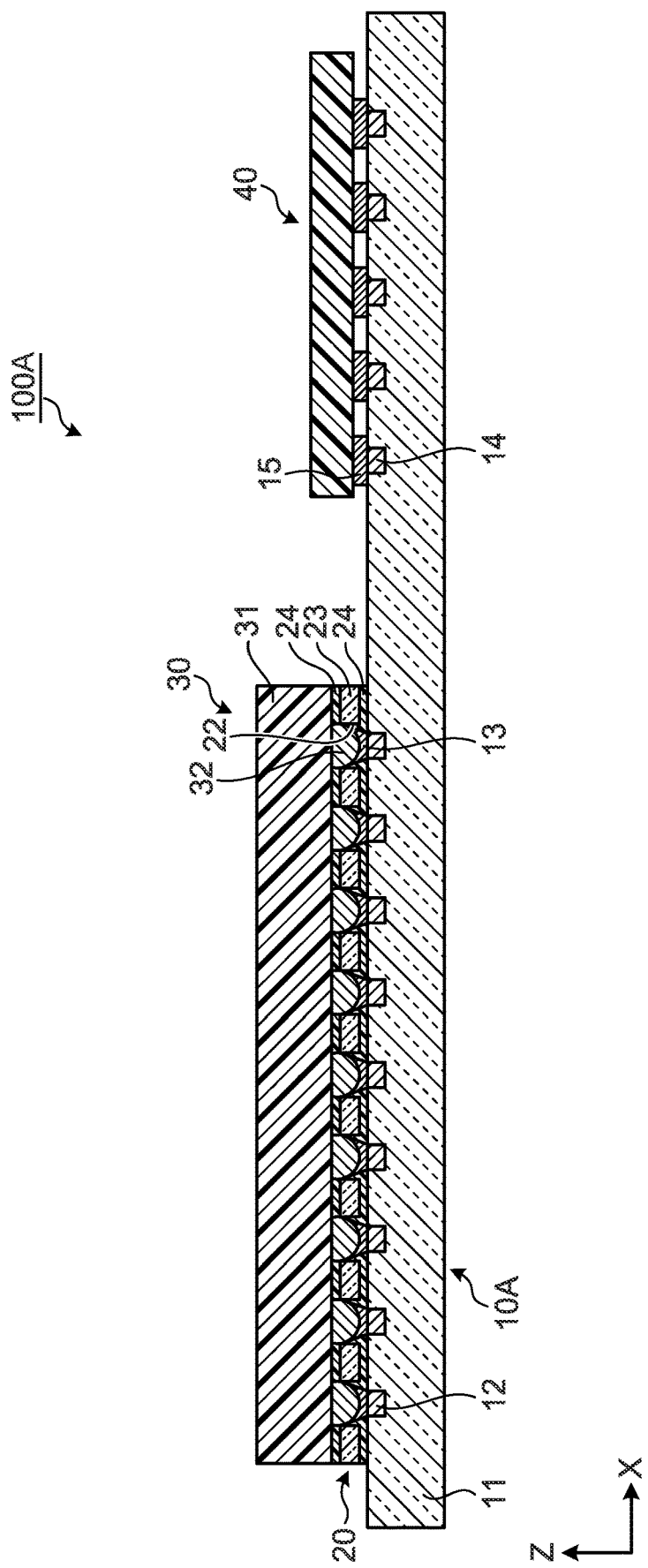
FIG. 14E is a view illustrating the method for producing the electronic substrate according to the seventh embodiment.

The resin portions 24 of the interposer 20 of the seventh embodiment cover the upper face and lower face of the spacer 23 as shown in FIG. 14B and the like.

Alternatively, as with the second embodiment, a resin portion 24 may cover the upper face and lower face of the spacer 23B and the surface of the through-holes 22. Alternatively, as with the third embodiment, a metal coating 25 covering the surface of the through-holes 22 may be provided.

The electronic substrate 100A according to the seventh embodiment may be produced as follows: on a substrate 10A having electrodes 12 onto which a first solder alloy 13 is applied, an interposer 20 having through-holes 22 in which bumps 32 of a first electronic component 30 are stored is placed; and the whole is heated for mounting.

The invention claimed is:

1. An interposer used for mounting a first electronic component on a substrate, the interposer comprising:
   a sheet-shaped spacer having at least one through-hole and including a material that is non-flowable during reflow soldering; and
   a resin portion that covers at least a part of the spacer and is flowable during reflow soldering, wherein:
   the through-hole is configured to receive a bump of the first electronic component.

2. The interposer according to claim 1, wherein:
   the spacer includes an insulating material having a smaller thermal expansion coefficient than that of the resin portion, and
   the resin portion covers an upper face and an lower face of the spacer.

3. The interposer according to claim 1, wherein the resin portion covers an upper face and a lower face of the spacer and a surface of the through-hole.

4. The interposer according to claim 2, wherein an inner surface of the through-hole is covered with a metal coating.

5. The interposer according to claim 1, wherein the spacer has a plurality of the through-holes arranged in a grid pattern.

6. The interposer according to claim 1, wherein:
   the through-hole is located in an outer peripheral area of the spacer, and
   the spacer has a void in an inner area from the outer peripheral area with the through-hole.

7. An electronic substrate comprising:
   a substrate;
   a first electronic component having a bump mounted on the substrate; and
   an interposer including a sheet-shaped spacer having at least one through-hole for receiving the bump of the first electronic component and including a resin portion covering at least a part of the spacer, the interposer being interposed between the substrate and the first electronic component, wherein:

an electrode of the substrate and the bump of the first electronic component are electrically connected through a first solder alloy, and the resin portion is physically connected to the substrate and the first electronic component.

8. The electronic substrate according to claim 7, wherein the resin portion is physically connected to the bump.

9. The electronic substrate according to claim 7, wherein the spacer includes an insulating material, an inner surface of the through-hole is covered with a metal coating, and the electrode, the bump, and the metal coating covering the inner surface of the through-hole are electrically connected through the first solder alloy.

10. The electronic substrate according to claim 7, further comprising a second electronic component mounted on the substrate, wherein:

a second solder alloy connecting the second electronic component and an electrode of the substrate has a higher melting point than a melting point of the first solder alloy connecting the first electronic component and the electrode of the substrate.

11. The electronic substrate according to claim 7, further comprising:

at least four of interposers, and the interposers are at positions corresponding to four corner areas of the first electronic component.

12. A method for producing an electronic substrate, the method comprising:

placing, on an upper face of a substrate, an interposer that includes a sheet-shaped spacer having at least one through-hole and including a material that is non-flowable during reflow soldering and includes a resin portion that covers at least a part of the spacer and is flowable during reflow soldering;

packing a first solder alloy in the through-hole of the interposer;

placing a first electronic component on an upper face of the interposer such that a bump of the first electronic component is in the through-hole of the interposer; and heating the substrate, the interposer, and the first electronic component at a temperature at which the first solder alloy melts and the resin portion is cured.

13. A method for producing an electronic substrate, the method comprising:

attaching, to a first electronic component, an interposer that includes a sheet-shaped spacer having at least one through-hole and including a material that is non-flowable during reflow soldering and includes a resin portion that covers at least a part of the spacer and is flowable during reflow soldering such that a bump of the first electronic component is in the through-hole;

applying a first solder alloy onto an electrode of a substrate;

placing the interposer on the substrate such that the through-hole is located on the electrode of the substrate; and heating the substrate, the interposer, and the first electronic component at a temperature at which the first solder alloy melts and the resin portion is cured.

14. The method for producing an electronic substrate according to claim 13, wherein before mounting the first electronic component, a second electronic component is mounted on the substrate through a second solder alloy having a higher melting point than a melting point of the first solder alloy.

* * * * *